United States Patent
Kaufman et al.

(10) Patent No.: US 6,217,416 B1
(45) Date of Patent: *Apr. 17, 2001

(54) CHEMICAL MECHANICAL POLISHING SLURRY USEFUL FOR COPPER/TANTALUM SUBSTRATES

(75) Inventors: Vlasta Brusic Kaufman, Geneva; Rodney C. Kistler, St. Charles; Shumin Wang, Naperville, all of IL (US)

(73) Assignee: Cabot Microelectronics Corporation, Aurora, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/105,065

(22) Filed: Jun. 26, 1998

(51) Int. Cl.$^7$ ................................................. C09K 13/00
(52) U.S. Cl. ................................................................ 451/41
(58) Field of Search ............................................... 451/41

(56) References Cited

U.S. PATENT DOCUMENTS

| | | | |
|---|---|---|---|
| 3,385,682 | 5/1968 | Lowen | 51/393 |
| 4,086,176 | 4/1978 | Ericson et al. | 252/100 |
| 4,671,851 | 6/1987 | Beyer et al. | 156/645 |
| 4,789,648 | 12/1988 | Chow et al. | 437/225 |
| 4,910,155 | 3/1990 | Cote et al. | 437/8 |
| 4,944,836 | 7/1990 | Beyer et al. | 156/645 |
| 4,956,313 | 9/1990 | Cote et al. | 437/203 |
| 5,137,544 | 8/1992 | Medellin | 51/308 |
| 5,157,876 | 10/1992 | Medellin | 51/281 R |
| 5,209,816 | 5/1993 | Yu et al. | 156/636 |
| 5,244,523 | 9/1993 | Tollini | 156/227 |
| 5,340,370 | 8/1994 | Cadien et al. | 51/308 |
| 5,354,490 | 10/1994 | Yu et al. | 252/79.1 |
| 5,391,258 | 2/1995 | Brancaleoni et al. | 156/636 |
| 5,407,526 | 4/1995 | Danielson et al. | 156/636 |
| 5,476,606 | 12/1995 | Brancaleoni et al. | 252/79.1 |
| 5,527,423 | 6/1996 | Neville et al. | 156/636.1 |
| 5,575,837 | 11/1996 | Kodama et al. | 106/3 |
| 5,645,736 | 7/1997 | Allman | 216/89 |
| 5,700,383 | 12/1997 | Fellner et al. | 216/88 |
| 5,735,963 | 4/1998 | Obeng | 134/3 |
| 5,770,095 | 6/1998 | Sasaki et al. | 216/38 |
| 5,800,577 | 9/1998 | Kido | 51/307 |
| 5,954,997 | * 9/1999 | Kaufman et al. | 252/79.1 |

FOREIGN PATENT DOCUMENTS

| | | |
|---|---|---|
| 0 357 205 | 3/1990 | (EP). |
| 0 811 665 | 12/1997 | (EP). |
| 831 136 | 3/1998 | (EP). |
| 0 846 742 | 6/1998 | (EP). |
| 1198312 | 7/1970 | (GB). |
| 8-83780 | 3/1995 | (JP). |
| WO 97/43087 | 11/1997 | (WO). |

OTHER PUBLICATIONS

Babu, et al., *Jun. 16–18, VMIC Conference–1998 IMIC–108/98–0443(c)*, pp. 443–448, Investigation of Cu and Ta Polishing Using Hydrogen Peroxide, Glycine, and a Catalyst (1998).

Carpio et al., *Journal: TSF (Thin Solid Films)*, Article: 6649, Initial Study on Copper CMP Slurry Chemistries (1995).

Hirabayashi et al., *Feb. 22–23, 1996 CMP–MIC Conference—96ISMIC—100P*, pp. 119–123, Chemical Mechanical Polishing of Copper Using a Slurry Composed of Glycine and Hydrogen Peroxide (1996).

Luo et al., *Feb. 22–23, 1996 CMP–MIC Conference 96ISMIC—100P*, pp. 145–151, Chemical–Mechanical Polishing of Copper In Acid Media (1996).

Steigerwald et al. *J. Electrom. Soc.*, vol. 142, No. 7, pp. 2379–2385, Electrochemical Potential Measurements During the Chemical–Mechanical Polishing of Copper Thin Films (1995).

* cited by examiner

*Primary Examiner*—A. L. Wellington
*Assistant Examiner*—William Hong

(57) ABSTRACT

The present invention is a first CMP slurry including an abrasive, an oxidizing agent, a complexing agent, a film forming agent and an organic amino compound, a second polishing slurry including an abrasive, an oxidizing agent, and acetic acid wherein the weight ratio of the oxidizing agent to acetic acid is at least 10 and a method for using the first and second polishing slurries sequentially to polish a substrate containing copper and containing tantalum or tantalum nitride or both tantalum and tantalum nitride.

11 Claims, No Drawings

CHEMICAL MECHANICAL POLISHING SLURRY USEFUL FOR COPPER/TANTALUM SUBSTRATES

BACKGROUND OF THE INVENTION

1. Field of the Invention

This invention concerns chemical mechanical polishing slurries that are useful when used in sequence for polishing a substrate including a copper portion and a tantalum portion. The invention includes a first chemical mechanical polishing slurry including an abrasive, an oxidizing agent, a complexing agent and at least one organic amino compound. The invention also includes a second chemical mechanical polishing slurry including an abrasive, an oxidizing agent and a complexing agent where the weight ratio of oxidizing agent to complexing agent is greater than 15. This invention also includes a method for using the first and second chemical mechanical polishing slurries to sequentially polish a substrate including a copper portion and a tantalum portion.

2. Description of the Art

Integrated circuits are made up of millions of active devices formed in or on a silicon substrate. The active devices, which are initially isolated from one another, are interconnected to form functional circuits and components. The devices are interconnected through the use of multilevel interconnections. Interconnection structures normally have a first layer of metallization, an interconnection layer, a second level of metallization, and sometimes a third and subsequent level of metallization. Interlevel dielectrics such as doped and undoped silicon dioxide ($SiO_2$), or low-k dielectrics tantalum nitride are used to electrically isolate the different levels of metallization in a silicon substrate or well. The electrical connections between different interconnection levels are made through the use of metallized vias. U.S. Pat. No. 5,741,626, which is incorporated herein by reference, describes a method for preparing dielectric tantalum nitride layers.

In a similar manner, metal contacts are used to form electrical connections between interconnection levels and devices formed in a well. The metal vias and contacts may be filled with various metals and alloys including titanium (Ti), titanium nitride (TiN), tantalum (Ta), aluminum copper (Al—Cu), aluminum silicon (Al—Si), copper (Cu), tungsten (W), and combinations thereof. The metal vias and contacts generally employ an adhesion layer such as titanium nitride (TiN), titanium (Ti), Tantalum (Ta), Tantalum nitride (TaN) or combinations thereof to adhere the metal layer to the $SiO_2$ substrate. At the contact level, the adhesion layer acts as a diffusion barrier to prevent the filled metal and $SiO_2$ from reacting.

In one semiconductor manufacturing process, metallized vias or contacts are formed by a blanket metal deposition followed by a chemical mechanical polish (CMP) step. In a typical process, via holes are etched through an interlevel dielectric (ILD) to interconnection lines or to a semiconductor substrate. Next, a thin adhesion layer such as tantalum nitride and/or tantalum is generally formed over the ILD and is directed into the etched via hole. Then, a metal film is blanket deposited over the adhesion layer and into the via hole. Deposition is continued until the via hole is filled with the blanket deposited metal. Finally, the excess metal is removed by chemical mechanical polishing, (CMP) to form metal vias. Processes for manufacturing and/or CMP of vias are disclosed in U.S. Pat. Nos. 4,671,851, 4,910,155 and 4,944,836.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is applied to the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed. The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects and corrosion and erosion. Furthermore, the polishing slurry may be used to provide controlled polishing selectivities to other thin-film materials used in current integrated circuit technology such as titanium, titanium nitride, tantalum, tantalum nitride, and the like.

Typically CMP polishing slurries contain an abrasive material, such as silica or alumina, suspended in an oxidizing, aqueous medium. For example, U.S. Pat. No. 5,244,534 to Yu et al. reports a slurry containing alumina, hydrogen peroxide, and either potassium or ammonium hydroxide that is useful to remove tungsten at predictable rates with little removal of the underlying insulating layer. U.S. Pat. No. 5,209,816 to Yu et al. discloses a slurry comprising perchloric acid, hydrogen peroxide and a solid abrasive material in an aqueous medium that is useful for polishing aluminum. U.S. Pat. No. 5,340,370 to Cadien and Feller discloses a tungsten polishing slurry comprising approximately 0.1 M potassium ferricyanide, approximately 5 weight percent silica and potassium acetate. Acetic acid is added to buffer the pH at approximately 3.5.

U.S. Pat. No. 4,789,648 to Beyer et al. discloses a slurry formulation using alumina abrasives in conjunction with sulfuric, nitric, and acetic acids and deionized water. U.S. Pat. Nos. 5,391,258 and 5,476,606 disclose slurries for polishing a composite of metal and silica which includes an aqueous medium, abrasive particles and an anion which controls the rate of silica removal. Other polishing slurries for use in CMP applications are described in U.S. Pat. No. 5,527,423 to Neville et al., U.S. Pat. No. 5,354,490 to Yu et al., U.S. Pat. No. 5,340,370 to Cadien et al., U.S. Pat. No. 5,209,816 to Yu et al., U.S. Pat. No. 5,157,876 to Medellin, U.S. Pat. No. 5,137,544 to Medellin, and U.S. Pat. No. 4,956,313 to Cote et al.

There are various mechanisms disclosed in the prior art by which metal surfaces can be polished with slurries. The metal surface may be polished using a slurry in which a surface film is not formed in which case the process proceeds by mechanical removal of metal particles and their dissolution in the slurry. In such a mechanism, the chemical dissolution rate should be slow in order to avoid wet etching. A more preferred mechanism is, however, one where a thin abradable layer is continuously formed by reaction between the metal surface and one or more components in the slurry such as a complexing agent and/or a film forming layer. The thin abradable layer is then removed in a controlled manner by mechanical action. Once the mechanical polishing process has stopped a thin passive film remains on the surface and controls the wet etching process. Controlling the chemical mechanical polishing process is much easier when a CMP slurry polishes using this mechanism.

Current copper containing substrates that are polished using chemical mechanical polishing also use Ta and TaN adhesion layers. Ta and TaN are chemically very passive and mechanically very hard and thus difficult to remove by polishing. The use of a single slurry, which performs with a high Cu:Ta selectivity demand prolonged polishing times for Ta, i.e. a significant overpolishing times for copper, during which there is a significant degradation of dishing and erosion performance.

Several relevant Cu chemistries have been discussed in the open literature, each failing to deliver a process which successfully addresses all of the key requirements of a chemical-mechanical polishing slurry useful for a substrate including both copper and tantalum. As a result, there is a need for one or more CMP slurries that can be used successfully to polish copper and tantalum containing substrates.

SUMMARY OF THE INVENTION

The present invention is directed to a first chemical mechanical polishing slurry that is able to selectively polish the copper portion of a copper and tantalum or tantalum nitride containing substrate.

The present invention is also directed to a second chemical mechanical polishing slurry that is able to selectively polishing the tantalum and/or tantalum nitride portion of a copper and tantalum and/or tantalum nitride containing substrate.

Furthermore, this invention is directed to methods for sequentially using a first and second chemical mechanical polishing slurry to polish a substrate including a copper portion and a tantalum and/or tantalum nitride portion.

Another aspect of this invention are first and second chemical mechanical polishing slurry precursors that lack an oxidizing agent and that are separately combined with an oxidizing agent prior to use to give a useful CMP slurries.

This invention is a first chemical mechanical polishing slurry. The first chemical mechanical polishing slurry comprising at least one abrasive, at least one oxidizing agent, at least one complexing agent, and at least one organic amino compound. A preferred embodiment of the first polishing slurry is a composition comprising alumina, at least one oxidizing agent, tartaric acid, benzotriazole, and at least one organic amino compound.

This invention also includes a second chemical mechanical polishing slurry comprising at least one abrasive, at least one oxidizing agent, and acetic acid wherein the weight ratio of oxidizing agent to acetic acid is greater than about 10. A preferred embodiment of the second chemical mechanical polishing slurry is a composition comprising an aqueous dispersion of alumina, hydrogen peroxide, from about 0.01 to about 3.0 wt% acetic acid, and from about 0.01 to about 0.2 wt% benzotriazole wherein the weight ratio of oxidizing agent to acetic acid is greater than about 10, and wherein the slurry has a pH of from about 4 to about 9.

This invention is also a method for polishing a substrate including a copper portion and a portion selected from tantalum or tantalum nitride. The method includes applying a first aqueous chemical mechanical polishing slurry comprising at least one abrasive, at least one oxidizing agent, at least one complexing agent, and at least one organic amino compound to the substrate. A portion of the copper is removed from the substrate by bringing a pad into contact with the substrate and moving the pad in relation to the substrate to give a partially polished substrate. A second slurry is applied to the partially polished substrate. The second chemical mechanical polishing slurry comprises at least one abrasive, at least one oxidizing agent, and acetic acid wherein the weight ratio of oxidizing agent to acetic acid is greater than about 10. At least a portion of the tantalum or tantalum nitride is removed from the partially polished substrate by bringing a pad into contact with the substrate and thereafter moving the pad in relation to the substrate to give a polished substrate.

DESCRIPTION OF THE CURRENT EMBODIMENT

The present invention relates to two chemical mechanical polishing slurries and to a method for using both slurries to sequentially polish a substrate including a copper portion and a tantalum or tantalum nitride portion at acceptable rates and with very few defects. Besides being used in combination to polish a copper and tantalum containing substrate, the first chemical mechanical polishing slurry may be used to polish a copper or copper alloy containing substrate, and the second polishing slurry can be used to polish a tantalum or tantalum nitride containing substrate.

Before describing the details of the various preferred embodiments of this invention, some of the terms that are used herein will be defined. The chemical mechanical polishing slurry, ("CMP slurry"), is a useful product of this invention that comprises an oxidizer, an abrasive, a complexing agent, an organic amino compound, and other optional ingredients. The CMP slurry is useful for polishing a multiple level metallization which may include but are not limited to semi-conductor thin-films, integrated circuit thin-films, and for any other films and surfaces where CMP processes are useful.

The terms "copper" and "copper containing alloys" are used interchangeably herein as it is within the understanding of one of skill in the art that the terms include but are not limited to substrates comprising layers of pure copper, copper aluminum alloys, and Ti/TiN/Cu, and Ta/TaN/Cu multi-layer substrates.

The terms "tantalum" and "tantalum containing alloys" are used interchangeably herein to refer to the tantalum and/or tantalum nitride adhesion layer under the conductive layer such as a conductive copper layer.

The first chemical mechanical polishing slurry is useful for polishing metals, especially copper and copper alloy containing metal layers associated with a substrate selected from the group including integrated circuits, thin films, multiple level semiconductors, and wafers.

I. The First Chemical Mechanical Polishing Slurry

The first CMP slurry is most useful for polishing the copper portion of a copper containing substrate of high rates. The first chemical mechanical polishing slurry may be useful for polishing other metal layers besides copper.

The first CMP slurry includes at least one oxidizing agent. The oxidizing agent aids in oxidizing the substrate metal layer or layers to their corresponding oxide, hydroxide, or ions. For example, in the first CMP slurry, the oxidizer may be used to oxidize a metal layer to its corresponding oxide or hydroxide, e.g., titanium to titanium oxide, tungsten to tungsten oxide, copper to copper oxide, and aluminum to aluminum oxide. The oxidizing agent is useful when incorporated into the first CMP slurry to polish metals and metal based components including titanium, titanium nitride, tantalum, copper, tungsten, aluminum, and aluminum alloys such as aluminum/copper alloys, and various mixtures and combinations thereof by mechanically polishing the metals to remove the respective oxide layer.

The oxidizing agents used in the first CMP slurry of this invention are one or more inorganic or organic per-compounds. A per-compound as defined by *Hawley's Condensed Chemical Dictionary* is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzyl peroxide, peracetic acid, and di-t-butyl peroxide, monopersulfates ($SO_5^-$), dipersulfates ($S_2O_8^-$), and sodium peroxide.

Examples of compounds containing an element in its highest oxidation state include but are not limited to periodic acid, periodate salts, perbromic acid, perbromate salts, perchloric acid, perchloric salts, perboric acid, and perborate salts and permanganates. Examples of non-per compounds that meet the electrochemical potential requirements include but are not limited to bromates, chlorates, chromates, iodates, iodic acid, and cerium (IV) compounds such as ammonium cerium nitrate.

Preferred oxidizing agents are peracetic acid, urea-hydrogen peroxide, hydrogen peroxide, monopersulfuric acid, dipersulfuric acid, salts thereof, and mixtures thereof including mixtures of urea and hydrogen peroxide. A most preferred oxidizing agent is the combination of hydrogen peroxide and urea.

The oxidizing agent may be present in the first chemical mechanical polishing slurry in an amount ranging from about 0.3 to about 30.0 weight percent. It is preferred that the oxidizing agent is present in the first CMP slurry of this invention in an amount ranging from about 0.3 to about 17.0 weight percent and most preferably from about 0.5 to about 12.0 weight percent.

An optional oxidizing agent is urea hydrogen peroxide. Because urea hydrogen peroxide is 34.5 wt % hydrogen peroxide and 65.5 wt % urea, a greater amount by weight of urea hydrogen peroxide must be included in the first CMP slurry to achieve the desired oxidizer loading set forth above. For example, a range of 0.5 to 12.0 weight percent oxidizing agent corresponds to a urea hydrogen peroxide weight three times as great or from 1.5 to 36.0 weight percent.

A first CMP slurry comprising urea hydrogen peroxide can be formulated by a number of methods including combining urea peroxide with water, and by combining urea and hydrogen peroxide in an aqueous solution in a mole ratio range of from about 0.75:1 to about 2:1 to give a urea hydrogen peroxide oxidizer.

The first CMP slurry of this invention forms a passivation layer on the substrate surface. Once a passivation layer is formed, it becomes important to be able to disturb the passivation layer in order to more easily abrade metal oxides from the substrate surface with the abrasive component of the first CMP slurry. One class of compounds that is included in the first CMP slurry for disturbing the passivation layer are complexing agents. Useful complexing agents include but are not limited to acids such as citric, lactic, malonic, tartaric, succinic, acetic, oxalic, and other acids, as well as amino acid and amino sulfuric acids, phosphoric acids, phosphonic acids, and their salts. A preferred first CMP slurry complexing agent is tartaric acid.

The complexing agent will be present in the first CMP slurry in an amount ranging from about 0.2 to about 5.0 weight present and preferably in an amount ranging from about 0.5 to about 3.0 weight percent.

The first CMP slurry of this invention will include at least one organic amino compound. The organic amino compounds absorb on the polished substrate and inhibit the substrate material removal rate. Organic amino compounds useful in the first CMP slurry include alkylamines, alcohol amines, amino acids, urea, derivatives of urea, and mixtures thereof. Preferred organic amino compounds are long chain alkylamines and alcoholamines. The term "long chain alkylamines" refers to alkylamines having from 7 to 12 or more carbon atoms including, for example, nonylamine and dodecylamine. Examples of useful alcoholamines include, but are not limited to monoethanolamine, and triethanolamine. Examples of useful derivatives of urea include, but are not limited to biurea. A preferred organic amino compound is the long chain alklyamine, dodecylamine. A preferred alcoholamine is triethanolamine.

The organic amino compound should be present in the first CMP slurry in an amount ranging from about 0.005 to about 10.0 weight percent. More preferably, the organic amino compound is present in the first CMP slurry in an amount ranging from about 0.01 to about 5.0 weight percent.

The first CMP slurry of this invention may include an optional film forming agent. The film forming agent may be any compound or mixtures of compounds that are capable of facilitating the formation of a passivation layer of metal oxides and dissolution inhibiting layers on the surface of the metal layer. Passivation of the substrate surface layer is important to prevent wet etching of the substrate surface. Useful film forming agents are nitrogen containing cyclic compounds such as imidazole, benzotriazole, benzimidazole and benzothiazole and their derivatives with hydroxy, amino, imino, carboxy, mercapto, nitro and alkyl substituted groups, as well as urea, thiourea and others. A preferred film forming agent is benzotriazole ("BTA").

The optional film forming agent may be present in the first CMP slurry of this invention in an amount ranging from about 0.01 weight percent to about 1.0 weight percent. It is preferred that film forming agent is present in the first CMP slurry in an amount ranging from about 0.01 to about 0.2 weight percent.

BTA, or other film forming agents included in the first CMP slurry may destabilize the uniform dispersion of abrasive in the slurry. In order to stabilize the first CMP slurry against settling, flocculation, and decomposition, a variety of optional CMP slurry additives, such as surfactants, stabilizers, or dispersing agents, can be used. If a surfactant is added to the first CMP slurry, then it may be an anionic, cationic, nonionic, or amphoteric surfactant or a combination of two or more surfactants can be employed. Furthermore, it has been found that the addition of a surfactant may be useful to reduce the within-wafer-non-uniformity (WIWNU) of the wafers, thereby improving the surface of the wafer and reducing wafer defects.

In general, the amount of additive such as a surfactant that may be used in the first CMP slurry should be sufficient to achieve effective stabilization of the slurry and will typically vary depending on the particular surfactant selected and the nature of the surface of the metal oxide abrasive. For example, if not enough of a selected surfactant is used, it will have little or no effect on first CMP slurry stabilization. On the other hand, too much surfactant in the CMP slurry may result in undesirable foaming and/or flocculation in the slurry. As a result, stabilizers such as surfactants should generally be present in the slurry of this invention in an amount ranging from about 0.001% to about 0.2% by weight, and preferably from about 0.001 to about 0.1 weight percent. Furthermore, the additive may be added directly to the slurry or treated onto the surface of the metal oxide abrasive utilizing known techniques. In either case, the amount of additive is adjusted to achieve the desired concentration in the first polishing slurry. Preferred surfactants useful in the first CMP slurry include dodecyl sulfate sodium salt, sodium lauryl sulfate, dodecyl sulfate ammonium salt, and mixtures thereof. Examples of preferred surfactants include TRITON® DF-16 manufactured by Union Carbide, and SURFYNOL® manufactured by Air Products and Chemicals.

It is desirable to maintain the pH of the first CMP slurry of this invention within a range of from about 2.0 to about 12.0, and preferably between from about 4.0 to about 8.0 in order to facilitate control of the CMP process. The pH of the CMP slurry of this invention may be adjusted using any known acid, base, or amine. However, the use of an acid or base that contains no metal ions, such as ammonium hydroxide and amines, or nitric, phosphoric, sulfuric, or organic acids are preferred to avoid introducing undesirable metal components into the first CMP slurry.

II. The Second Chemical Mechanical Polishing Slurry

The second CMP slurry is formulated so that it exhibits a low polishing rate towards copper and a typical polishing rate towards tantalum or tantalum nitride. It is preferred, therefore, that the second CMP slurry has a copper to tantalum polishing selectivity of less than about 2 to 1 and most preferably and less than about 1 to 5.

The second CMP slurry includes at least one oxidizing agent. The oxidizing agent aids in oxidizing the substrate metal layer or layers to their corresponding oxide, hydroxide, or ions. For example, in the second CMP slurry, the oxidizer may be used to oxidize a metal layer to its corresponding oxide or hydroxide, e.g., tantalum to tantalum oxide. The oxidizing agent is useful when incorporated into the second CMP slurry to polish metals and metal based components including titanium, titanium nitride, tantalum, copper, tungsten, aluminum, and aluminum alloys such as aluminum/copper alloys, and various mixtures and combinations thereof by mechanically polishing the metals with removal of the respective oxide layer.

The oxidizing agents used in the second CMP slurry of this invention are one or more inorganic or organic per-compounds. A per-compound as defined by *Hawley's Condensed Chemical Dictionary* is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzyl peroxide, peracetic acid, and di-t-butyl peroxide, monopersulfates ($SO_5^-$), dipersulfates ($S_2O_8^-$), and sodium peroxide.

Examples of compounds containing an element in its highest oxidation state include but are not limited to periodic acid, periodate salts, perbromic acid, perbromate salts, perchloric acid, perchloric salts, perboric acid, and perborate salts and permanganates. Examples of non-per compounds that meet the electrochemical potential requirements include but are not limited to bromates, chlorates, chromates, iodates, iodic acid, and cerium (IV) compounds such as ammonium cerium nitrate.

Non-exclusive examples of useful oxidizing agents include, but are not limited to peracetic acid, urea-hydrogen peroxide, hydrogen peroxide, monopersulfuric acid, dipersulfuric acid, salts thereof, and mixtures thereof including mixtures of urea and hydrogen peroxide. A preferred oxidizing agent is hydrogen peroxide.

The oxidizing agent may be present in the second chemical mechanical polishing slurry in an amount ranging from about 0.3 to about 30.0 weight percent. It is preferred that the oxidizer is present in the second CMP slurry of this invention in an amount ranging from about 0.3 to about 17.0 weight percent and most preferably from about 1.0 to about 12.0 weight percent.

One class of compounds that is included in the second CMP slurry are complexing agents. Useful complexing agents include but are not limited to acids such as citric, lactic, tartaric, succinic, acetic, oxalic and other acids, as well as amino acid and amino sulfuric acids, phosphonic acids, phosphoric acids, and their salts. A preferred complexing agent is acetic acid. The complexing agent will be present in the CMP slurry of this invention in an amount ranging from about 0.1 to about 5.0 weight present and preferably in an amount ranging from about 0.1 to about 3.0 weight percent.

It is important that the second CMP slurry include a far smaller weight amount of complexing agent in comparison of the weight amount of oxidizing agent in the slurry. The second CMP slurry should have a oxidizing agent to complexing agent weight ratio greater than about 10, and preferably greater than about 25.

The second CMP slurry of this invention may include an optional film forming agent. The film forming agent may be any compound or mixtures of compounds that are capable of facilitating the formation of a passivation layer of metal oxides and dissolution inhibiting layers on the surface of the metal layer. Passivation of the substrate surface layer is important to prevent wet etching of the substrate surface. Useful film forming agents are nitrogen containing cyclic compounds such as imidazole, benzotriazole, benzimidazole and benzothiazole and their derivatives with hydroxy, amino, imino, carboxy, mercapto, nitro and alkyl substituted groups, as well as urea, thiourea and others. A preferred film forming agent is benzotriazole ("BTA"). The film forming agent may be present in the second CMP slurry in an amount ranging from about 0.01 weight percent to about 1.0 weight percent. It is preferred that film forming agent is present in the second CMP slurry in an amount ranging from about 0.01 to about 0.5 weight percent.

BTA, or other film forming agents included in the second CMP slurry may destabilize the uniform dispersion of abrasive in the slurry. In order to stabilize the second CMP slurry against settling, flocculation, and decomposition, a variety of optional CMP slurry additives, such as surfactants, stabilizers, or dispersing agents, can be used. If a surfactant is added to the second CMP slurry, then it may be an anionic, cationic, nonionic, or amphoteric surfactant or a combination of two or more surfactants can be employed. Furthermore, it has been found that the addition of a surfactant may be useful to reduce the within-wafer-non-uniformity (WIWNU) of the wafers, thereby improving the surface of the wafer and reducing wafer defects.

In general, the amount of additive such as a surfactant that may be used in the second CMP slurry should be sufficient to achieve effective stabilization of the slurry and will typically vary depending on the particular surfactant selected and the nature of the surface of the metal oxide abrasive. For example, if not enough of a selected surfactant is used, it will have little or no effect on CMP slurry stabilization. On the other hand, too much surfactant in the second CMP slurry may result in undesirable foaming and/or flocculation in the slurry. As a result, stabilizers such as surfactants should generally be present in the second slurry in an amount ranging from about 0.001% to about 0.2% by weight, and preferably from about 0.001 to about 0.1 weight percent. Furthermore, the additive may be added directly to the slurry or treated onto the surface of the metal oxide abrasive utilizing known techniques. In either case, the amount of additive is adjusted to achieve the desired concentration in the first polishing slurry. Preferred surfactants include dodecyl sulfate sodium salt, sodium lauryl sulfate, dodecyl sulfate ammonium salt, and mixtures thereof. Examples of useful surfactants include TRITON® DF-16 manufactured by Union Carbide, and SURFYNOL® manufactured by Air Products and Chemicals.

It is desirable to maintain the pH of the second CMP slurry of this invention within a range of from about 2.0 to about 12.0, and preferably between from about 4.0 to about 9.0 in order to facilitate control of the CMP process. The pH of the CMP slurry of this invention may be adjusted using any known acid, base, or amine. However, the use of an acid or base that contains no metal ions, such as ammonium hydroxide and amines, or nitric, phosphoric, sulfuric, or organic acids are preferred to avoid introducing undesirable metal components into the CMP slurry of this invention. It is most preferred that the second CMP slurry has a pH of from about 4 to about 7.5.

III. The Abrasive

The first and second CMP slurries of this each invention include an abrasive. The abrasive is typically a metal oxide. The metal oxide abrasive may be selected from the group including alumina, titania, zirconia, germania, silica, ceria and mixtures thereof. The first and second CMP slurries of this invention preferably each include from about 0.5 to about 15.0 weight percent or more of an abrasive. It is more preferred, however, that the first and second CMP slurries of this invention include from about 1.5 to about 6.0 weight percent abrasive.

The metal oxide abrasive may be produced by any techniques known to those skilled in the art. Metal oxide abrasives can be produced using any high temperature process such as sol-gel, hydrothermal or, plasma process, or by processes for manufacturing fumed or precipitated metal oxides. Preferably, the metal oxide is a fumed or precipitated abrasive and, more preferably it is a fuimed abrasive such as fumed silica or fumed alumina. For example, the production of fuimed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

A preferred metal oxide will have a surface area, as calculated from the method of S. Brunauer, P. H. Emmet, and I. Teller, J. Am. Chemical Society, Volume 60, Page 309 (1938) and commonly referred to as BET, ranging from about 5 $m^2$/g to about 430 $m^2$/g and preferably from about 30$m^2$/g to about 170 $m^2$/g. Due to stringent purity requirements in the IC industry the preferred metal oxide should be of a high purity. High purity means that the total impurity content, from sources such as raw material impurities and trace processing contaminants, is typically less than 1% and preferably less than 0.01% (i.e., 100 ppm).

The metal oxide abrasive useful in the dispersion of this invention may consist of metal oxide aggregates or individual single sphere particles. The term "particle" as it is used herein refers to both aggregates of more than one primary particle and to single particles.

It is preferred that the metal oxide abrasive consists of metal oxide particles having a size distribution less than about 1.0 micron, a mean particle diameter less than about 0.4 micron and a force sufficient to repel and overcome the van der Waals forces between abrasive aggregates themselves. Such metal oxide abrasives have been found to be effective in minimizing or avoiding scratching, pit marks, divots and other surface imperfections during polishing. The particle size distribution in the present invention may be determined utilizing known techniques such as transmission electron microscopy (TEM). The mean particle diameter refers to the average equivalent spherical diameter when using TEM image analysis, i.e., based on the cross-sectional area of the particle. By force is meant that either the surface potential or the hydration force of the metal oxide particles must be sufficient to repel and overcome the van der Waals attractive forces between the particles.

In another preferred embodiment, the metal oxide abrasive may consist of discrete, individual metal oxide particles having a primary particle diameter less than 0.4 micron (400nm) and a surface area ranging from about 10 $m^2$/g to about 250 $m^2$/g.

Preferably, the metal oxide abrasive is incorporated into the aqueous medium of the polishing slurry as a concentrated aqueous dispersion of metal oxides, comprising from about 3% to about 45% solids, and preferably between 10% and 20% solids. The aqueous dispersion of metal oxides may be produced utilizing conventional techniques, such as slowly adding the metal oxide abrasive to an appropriate media, for example, deionized water, to form a colloidal dispersion. The dispersion is typically completed by subjecting it to high shear mixing conditions known to those skilled in the art. The pH of the slurry may be adjusted away from the isoelectric point to maximize colloidal stability.

IV. Optional Additives

Other well known polishing slurry additives may be incorporated into the first CMP slurry and/or into the second CMP slurry. One class of optional additives are inorganic acids and/or salts thereof which may be added to the first and/or second CMP slurry to further improve or enhance the polishing rate of the barrier layers in the wafer, such as titanium and tantalum. Useful inorganic additives include sulfuric acid, phosphoric acid, phosphonic acid, nitric acid, HF acid, ammonium fluoride, ammonium salts, potassium salts, sodium salts or other cationic salts of sulfates, phosphates, phosphonates, and fluorides.

V. Methods of Making and Using the First and Second CMP Slurries

The first and second CMP slurries of this invention may be produced using conventional techniques known to those skilled in the art. Typically, the oxidizing agent and other non-abrasive components, are mixed into an aqueous medium, such as deionized or distilled water, at predetermined concentrations under low shear conditions until such components are completely dissolved in the medium. A concentrated dispersion of the metal oxide abrasive, such as fumed alumina, is added to the medium and diluted to the desired loading level of abrasive in the final CMP slurry.

The first and second CMP slurries of the present invention may be supplied as one package system including all of the slurry additives. Due to concerns about shipping CMP slurries containing oxidizing agents, and especially hydrogen peroxide, it is preferred that the first and second CMP slurries of this invention are prepared and packaged as a CMP precursor containing every ingredient except the oxidizing agent or agents, shipped to a customer, and combined with hydrogen peroxide or any oxidizing agent at the customer's facility prior to use. Therefore, an aspect of this invention is a first and second CMP composition and/or slurry precursor comprising one or more ingredients selected from the group including catalysts, abrasives, and stabilizers in dry or aqueous form but lacking an oxidizing agent. The first and second CMP precursors are separately combined with at least one oxidizing agent prior to use.

It has been determined that first and second CMP slurries of this invention including urea hydrogen peroxide can be formulated by adding hydrogen peroxide to a slurry precursor comprising urea and any other useful slurry components to give a urea hydrogen peroxide containing CMP slurries.

A preferred slurry precursor of this invention will comprise a dry or aqueous mixture of urea and at least one metal oxide abrasive. Additional ingredients may be incorporated into the urea containing slurry precursor are useful in first and second CMP slurries.

Although the CMP slurry of this invention may be used to polish any type of metal layer, the first chemical mechanical polishing slurry of this invention has been found to have a high copper, and low tantalum and tantalum nitride polishing rate. In addition, the second chemical mechanical polishing slurry exhibits desirable low polishing rates towards the copper layer, while exhibiting a desirable high polishing rate towards the tantalum dielectric insulating layer.

The first and second CMP slurries may be used with any standard polishing equipment appropriate for use on the desired metal layer of the wafer. The first and second CMP slurries of this invention are most useful for polishing a substrate including either a tantalum or tantalum nitride portion and a copper alloy containing portion, both over a dielectric layer.

When used to polish a substrate including a tantalum or tantalum nitride portion and a copper portion, the first chemical mechanical polishing slurry is applied to the substrate and the substrate is polished by conventional means using polishing machines and a polishing pad. When substrate polishing using the first CMP slurry is complete, the substrate may be washed with deionized water or other solvents to remove the first CMP slurry from the partially polished substrate. Next, the second CMP slurry of this invention is applied to the substrate and the substrate is polished using conventional techniques in order to preferentially polish the tantalum or tantalum nitride portion in comparison to the copper portion of the partially polished substrate. Once the second polishing step is complete, the second CMP slurry is washed from the substrate with deionized water or another solvent and the substrate is ready for further processing.

In both polishing steps, the first and/or the second CMP slurries may be applied directly to the substrate, to a polishing pad, or to both in a controlled manner during substrate polishing. It is preferred however that the first and second CMP slurries are applied to the pad which thereafter is placed against the substrate after which the pad is moved in relationship to the substrate in order to achieve substrate polishing.

The first and second CMP slurries polishes copper, titanium, titanium nitride, tantalum, and tantalum nitride layers at good rates under controllable conditions. The polishing slurries of the present invention may be used during the various stages of semiconductor integrated circuit manufacture to provide effective polishing at desired polishing rates while minimizing surface imperfections and defects.

EXAMPLES

We have discovered a first CMP slurry that polished copper at high rate and tantalum and tantalum nitride layers at lesser rates, and a second CMP slurry that polishes tantalum and tantalum nitride layers at acceptable rates and copper at comparatively lower rates than the first CMP slurry.

The following examples illustrate preferred embodiments of this invention as well as preferred methods for using CMP slurries of this invention.

EXAMPLE 1

In this example, CMP polishing was accomplished using two CMP slurries. The first slurry included an aqueous dispersion of 3.0 weight percent of a fumed alumina abrasive from SEMI-SPERSE® W-A355 dispersion sold by the Microelectronics Materials Division of Cabot Corporation, in Aurora, Ill., 2.5 wt% hydrogen peroxide, 3.65 wt% urea, 1.25 wt% tartaric acid, and 50 ppm Triton DF-16 surfactant. The second slurry included all of the components of the first slurry plus 0.015 wt% dodecylamine. Both slurries tested were adjusted to a pH of 7.0 with ammonium hydroxide.

The CMP slurries were tested by two methods. Dissolution rates of Cu and Ta in each slurry were tested by electrochemical techniques. The set-up used a rotating disk electrode in a three-electrode cell with a 273 potentiostat and Corrosion Software by PAR. Electrochemical data where obtained with a pre-selected electrode rotation of 500 rpm (or 19.94 m/sec maximum) with the rotator and the metal of interest in contact with the abrasive pad (with a down force of 5.9 psi) or raised above the pad. Thus metal dissolution could be evaluated as its surface was abraded as well as after abrasion. The former value was assumed to be an approximate measure of the chemical rate during polishing, while the later approach gave the corrosion rate of the metal in a given slurry. In typical tests, electrochemical data ware recorded as a potentiodynamic polarization curves, with the potential swept by a rate of 10 mV/sec from about –0.25 V cathodic to the open potential to some anodic potential. The test results are listed in Table 1, columns 3–4.

The copper and tantalum polishing rates, using the same slurries, were evaluated with an IPEC 472 polishing machine using a down force of 3 psi, a table speed of 55 rpm, and a spindle speed of 30 rpm. The slurries were applied to an IC 1000/SUBA IV pad stack manufactured by Rodel at a rate of 200 ml/min. Polishing data are reported in Table 1, columns 5–6.

TABLE 1

| | Slurry | Metal dissolution rate w/abrasion Å/min | Metal corrosion rate after abrasion Å/min | Metal removal rate in polishing Å/min | Cu:Ta Selectivity Ratio |
|---|---|---|---|---|---|
| 1 | 3% alumina, 2.5% $H_2O_2$, 3.65% urea, 1.25 wt % tartaric acid, 50 ppm Triton DF-16 | Cu:240 Ta:140 | Cu:36 Ta:0.4 | Cu:2750 Ta:415 | 6.6:1 |
| 2 | as 1 plus 0.015% dodecylamine | Cu:240 Ta:60 | Cu:4.8 Ta:0.12 | Cu:2250 Ta:50 | 45:1 |

Adding a small amount of dodecylamine into the slurry inhibits Ta removal and significantly increases the Cu:Ta selectivity ratio to about 45:1. This makes the organic amino compound containing slurry more suitable for use as copper polishing slurry with a polishing stop on Ta.

The results of the Table 1 also indicate that trends observed in electrochemical tests are reproduced in polishing: dodecylamine inhibits Ta dissolution with abrasion, and therewith the polishing rate, in a more pronounced fashion than measured on copper. Thus dodecylamine is a dissolution inhibitor for Ta.

EXAMPLE 2

This example studies the effect of varying the weight ratio of oxidizing agent and complexing agent is second CMP slurries of this invention on copper and tantalum dissolution rates. This example used a CMP slurry having the following composition; 1.25 weight percent tartaric acid; hydrogen peroxide in an amount identified in Table 2; 3.0 weight percent alumina abrasive (W-A355), 50 ppm Triton DF-16 surfactant with the remainder being deionized water. The pH of the slurries were adjusted to 7.0 using ammonium hydroxide.

Polishing results using slurries with different ratios of tartaric acid and hydrogen peroxide oxidizing agent are listed in Table 2. In addition to the compounds listed in Table 2, each slurry contained 3.65wt % urea. The polishing rates were determined using blanket wafers on an IPEC 472 polishing tool, with an IC1000/SUBA IV pad stack manufactured by Rodel. The wafers were polished using a 3 psi down force, a table speed of 55 rpm, a spindle speed of 30 rpm, and a slurry flow rate of 200 ml/min.

TABLE 2

| Run # | % tartaric | % HPO | T:HPO | Cu polishing rate, A/min | Ta polishing rate A/min |
|---|---|---|---|---|---|
| 1 | 1.25 | 7.5 | 1:6 | 2,622 | 288 |
| 2 | 1.25 | 5.0 | 1:4 | 3,265 | 304 |
| 3 | 1.25 | 2.5 | 1:2 | 4,711 | 274 |

The polishing results show that increasing the tartaric acid/peroxide weight ratio increases the Cu removal rate without significantly affecting the Ta rate.

Metal dissolution and corrosion rates using the same base slurries described above but with varying tartaric acid amounts (T) and varying hydrogen peroxide amounts HPO) were evaluated by electrochemical methods according to the method set forth in Example 1 with the results being reported in Table 3.

TABLE 3

| Run# | % tartaric | % HPO | T:HPO | Cu dissolution rate, Å/min with abrasion | Cu corrosion rate Å/min, after abrasion |
|---|---|---|---|---|---|
| 1 | 0.5 | 6 | 1:12 | 163 | 16.3 |
| 2 | 1 | 6 | 1:6 | 163 | 19.2 |
| 3 | 0.5 | 2 | 1:4 | 240 | 19.2 |
| 4 | 1 | 2 | 1:2 | 314 | 38.4 |
| 5 | 3 | 6 | 1:2 | 360 | 57.6 |
| 6 | 1 | 1 | 1:1 | 344 | 50.4 |
| 7 | 2 | 2 | 1:1 | 336 | 62.6 |
| 8 | 3 | 2 | 1:1 | 336 | 62.6 |

The results from Tables 2 and 3 show that the copper polishing rate corresponds to the activity measured on copper electrochemically, both decreasing with an increase of the weight ratio of oxidizing agent to complexing agent, while the tantalum polishing rate and electrochemical dissolution, are essentially unaffected by the changing composition.

EXAMPLE 3

The trends observed in Example 2, Table 3 were used as the basis for formulating a second chemical mechanical polishing slurry useful for polishing tantalum and tantalum nitride. The copper and tantalum polishing rates for several second polishing slurry candidates are reported in Table 4, below. The alumina used in the chemical mechanical polishing slurries was a fumed alumina diluted from SEMI-SPERSE® W-A355, an alumina dispersion sold by the Microelectronics Materials Division of Cabot Corporation, in Aurora, Ill.

TABLE 4

| | Slurry | Cu Removal rate, Å/min | Ta Removal rate, Å/min | PETEOS Rem. Rate Å/min | Cu:Ta Sel |
|---|---|---|---|---|---|
| 1 | 2% alumina, 5% $H_2O_2$, 0.5% tartaric, pH 7.0 | 651 | 337 | 64 | 1.9:1 |
| 2 | 5% alumina, 5% $H_2O_2$, 0.2% tartaric, 0.2% acetic, 2% urea, 0.08% BTA, 50 ppm Triton DF-16, pH 6 | 260 | 244 | 8 | |
| 3 | 3% alumina, 5% $H_2O_2$, 0.2% acetic acid, 0.08% BTA, 50 ppm Triton DF-16, pH 5.0 | 66 | 299 | 135 | 1:4.5 |

Increasing the ratio of oxidizing agent to complexing agent to a value greater than 10 significantly decreased copper removal rates as shown in Table 4. Furthermore, the date in Table 4 shows that acetic acid, which is a poor copper complexing agent, significantly inhibits the copper removal rate while the tantalum removal rate remains essentially unaffected.

What we claim is:

1. A chemical mechanical polishing slurry comprising:
   at least one abrasive;
   at least one oxidizing agent;
   acetic acid; and
   at least one film forming agent, wherein the weight ratio of oxidizing agent to acetic acid is greater than about 10, and wherein the slurry has a pH of from about 4 to about 9.

2. The chemical mechanical polishing slurry of claim 1 wherein the film forming agent is from about 0.01 to about 0.2 wt % benzotriazole.

3. The chemical mechanical polishing slurry of claim 1 wherein the oxidizing agent is hydrogen peroxide.

4. A chemical mechanical polishing slurry comprising:
   at least one abrasive;
   at least one oxidizing agent; and
   acetic acid, wherein the weight ratio of oxidizing agent to acetic acid is greater than about 10.

5. The chemical mechanical polishing slurry of claim 4 including a film forming agent.

6. The chemical mechanical polishing slurry of claim 5 wherein the film forming agent is benzotriazole.

7. The chemical mechanical polishing slurry of claim 6 including from about 0.01 to about 0.5 weight percent benzotriazole.

8. The chemical mechanical polishing slurry of claim 4 wherein the acetic acid is present in an amount ranging from about 0.01 to about 3.0 wt %.

9. The chemical mechanical polishing slurry of claim 4 having a pH of from about 4 to about 9.

10. The chemical mechanical polishing slurry of claim 4 wherein the abrasive is at least one metal oxide.

11. The chemical mechanical polishing slurry of claim 10 wherein the metal oxide abrasive is selected from the group including alumina, ceria, germania, silica, titania, zirconia, and mixtures thereof.

* * * * *